US006411180B1

(12) United States Patent
Henningsson et al.

(10) Patent No.: US 6,411,180 B1
(45) Date of Patent: Jun. 25, 2002

(54) FILTER

(75) Inventors: Uno Henningsson, Haninge; Patrik Lindell, Järfälla; Patrik Lustig, Stockholm, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/549,815

(22) Filed: Apr. 14, 2000

(30) Foreign Application Priority Data

Apr. 16, 1999 (SE) ........................................... 9901365

(51) Int. Cl.[7] ............................ H01P 1/20; H03H 7/00

(52) U.S. Cl. ....................... 333/202; 333/206; 333/182; 333/184

(58) Field of Search ................................ 333/202, 206, 333/182, 184

(56) References Cited

U.S. PATENT DOCUMENTS

| | | | | |
|---|---|---|---|---|
| 4,680,560 A | * 7/1987 | Yorita et al. | ................ | 333/206 |
| 4,801,904 A | * 1/1989 | Sakamoto et al. | .......... | 333/182 |
| 5,382,932 A | * 1/1995 | Monti | ........................ | 333/245 |
| 6,165,019 A | * 12/2000 | Kha et al. | .................. | 333/182 |

FOREIGN PATENT DOCUMENTS

JP 404255681 A * 9/1992

OTHER PUBLICATIONS

Patent Abstract of Japan, abstract of JP 57–41004 A, Mar. 6, 1982.

Patent Abstract of Japan, abstract of JP 8/18305 A, Jan. 1996.

Patent Abstract of Japan, abstract of JP 246804 A, Sep. 1997.

Patent Abstract of Japan, abstract of JP 56–76602 A, Jun. 24, 1981.

* cited by examiner

*Primary Examiner*—Robert Pascal
*Assistant Examiner*—Patricia T. Nguyen
(74) *Attorney, Agent, or Firm*—Burns, Doane, Swecker & Mathis, L.L.P.

(57) ABSTRACT

A filter includes a first end, a second end, a conducting casing, at least one central conductor, and connecting devices at each of the ends, the casing extending along an imaginary axis and intended to accommodate the conductor along this imaginary axis. The conductor is provided with capacitance generating portions and inductance generating portions. The connecting device at the first end of the filter includes a first connecting member connected to the casing and a second connecting member connected to the conductor, and the connecting device at the second end of the filter includes a third connecting member connected to the casing and a fourth connecting member connected to the conductor. Both the second and the fourth connecting members are provided integrally with the conductor.

16 Claims, 2 Drawing Sheets

FILTER

BACKGROUND

The present invention relates to a filter comprising a first end, a second end, a conducting casing, at least one central conductor, and one connecting means at the ends, respectively. The casing extends along an imaginary axis and is intended to accommodate the conductor along this imaginary axis, and further the conductor is provided with alternating capacitance generating portions and inductance generating portions. The connecting means at the first end of the filter comprises a first connecting member connected to the casing and a second connecting member connected to the conductor, and the connecting means at the second end of the filter comprises a third connecting member connected to the casing and a fourth connecting member connected to the conductor.

Such a filter is known from JP-08018305 A, which accordingly describes the technique, which is used as a base for the invention.

SUMMARY

In radio base stations, frequency filters, especially low-pass filters (LP-filters), are used. The filters comprises separate units and can be integrated with and connected to other units by means of soldering or mechanical joining. Connections involve always a risk for, for instance, bad electrical contact and the more pieces and connections there are the more problems with contact will arise. Another problem with conventional LP-filters, where the conductor is enclosed in a plastic tube, which in turn is enclosed in a conducting casing, is that there could be a play between the insulator and the two conductors of the capacitor, which will give rise to a bad defined capacitance, which means an uncertain interval for the passed frequency.

The above mentioned problems are solved by a filter of the above defined kind, which is characterised in that both the second and fourth connecting members are provided integrally with the conductor. The finesse is that the filter is integrated with a connector. The contact is actually the end of the conductor of the filter.

It is suitable that an insulator covers at least one part of at least one of the capacitance generating portions of the conductor and that the insulator is arranged on said portion. The insulator gives a protection against breakdown voltage across the capacitance generating portions and the casing.

Preferably the insulator is cast directly on said capacitance generating portions. This provides that the capacitance can be determined more precisely since play that can occur between the insulator and one of the conductors of the capacitor is avoided.

Preferably there is at least one axially directed junction means between each capacitance generating portion, which connects the insulator around these with each other, the junction means consisting of the same material that is cast around the portions, the insulator and the junction means providing a continuous unit. The junction means thereby enables the casting of the insulator in one piece.

Suitably the casing is provided with at least one stopping means to fasten the conductor co-axially in the casing.

Further it is advantageous that one of the stopping means is a projection on the inside of the casing at one of the ends, whereby the capacitance generating portion, which is closest to the second connecting member and together with the insulator has a diameter that is sized such that it precisely fits in the rest of the casing, is stopped at the projection.

It is suitable that at least one of the stopping means comprises at least one emboss in the casing, this emboss causing a decrease in the inner diameter of the casing. This decrease in diameter pushes preferably the capacitance generating portion that is closest to the second or fourth connecting member, and thus the whole conductor, axially towards the stopping means in the opposite end.

Further at least one of the stopping means can comprise a ring of insulating material, which is placed around the soldering connection end against one part of the conductor, which has a slightly larger diameter than the soldering connection end and a ring-shaped edge, outermost at the other end of the casing, which is folded in over the ring, this folding causing that the ring and thereby the whole conductor is pressed against the stopping means in the opposite end. This contributes to a mounting of the conductor in the casing without play.

At least one of the second and fourth connecting members could be a soldering connection end.

It is suitable that at least one of the second and fourth connecting members is provided as a circularly cylindrical shell extended in the longitudinal direction, one of the ends of which is free, and from this is at least one axially directed slit taken from the free end towards the capacitance generating portion that is closest to the fourth connecting member.

Preferably the first connecting member and the third connecting member are provided integrally with the casing and the casing is provided in one piece. This provides that grounding problems are decreased since the connector and the filter have the same potential, when they are provided integrally.

Preferably the first and third connecting members are provided with threads. Hereby a safe connection is obtained between the filter and connecting parts.

Preferably the conductor is provided in one piece, whereby the filter is a low-pass filter.

Alternatively, at least one of the capacitance generating portions is divided into two smaller portions, which are following each other in the direction of the axis, the portions being separated by a gap, which is filled with at least one dielectric, for example air, ceramic or a polymeric material, whereby the filter is a band-pass filter.

It is advantageous in the manufacturing that said dielectric is of the same insulating material that is cast around the portions, whereby the insulator and the dielectric together compose a continues unity.

It is further advantageous that the casing as well as the different portions of the conductor are essentially circularly cylindrical, the capacitance generating portions having the largest diameter, and that at least one of the portions is arranged co-axially along the imaginary axis (I).

Suitably, at least the capacitance generating portions and the inductance generating portions of the conductor are silvered. Hereby a good conductivity is obtained since the current is conducted along the surface.

Since the number of pieces is reduced also the manufacturing costs are reduced.

DETAILED DESCRIPTION

Figure 1:
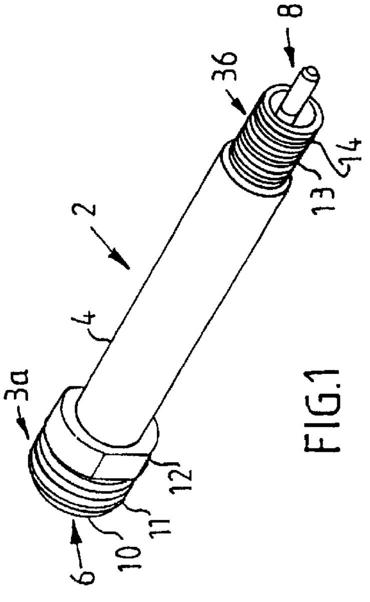
FIG. 1 shows a filter with integrated connecting means in perspective.

FIG. 1 is a view in perspective of a first embodiment of a filter 2 according to the invention. The filter 2 comprises integrated connecting means 3*a* and 3*b*. The filter 2 comprises also an essentially circularly cylindrical, metallic casing 4, which has a first open end 6 and a second open end 8. The first open end 6 comprises outermost a first connecting member 10 provided with threads 11, and closer to the middle of the casing, but still in the first end 6, a part 12, a key handle, which has a slightly larger diameter than the casing 4 and which comprises two opposite bevels. The other end 8 comprises a third connecting member 13, which is provided with threads 14. Besides keeping connecting parts in place the threads 11,14 contribute in providing good contact with connecting parts.

Figure 2:
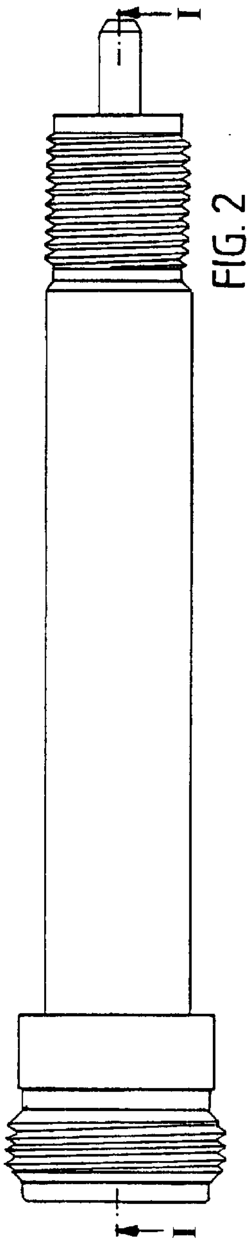
FIG. 2 shows the filter according to FIG. 1 in a face view.

FIG. 2 shows the filter 2 according to FIG. 1 with a concentric axis I passing through the filter 2 in its longitudinal direction.

Figure 3:
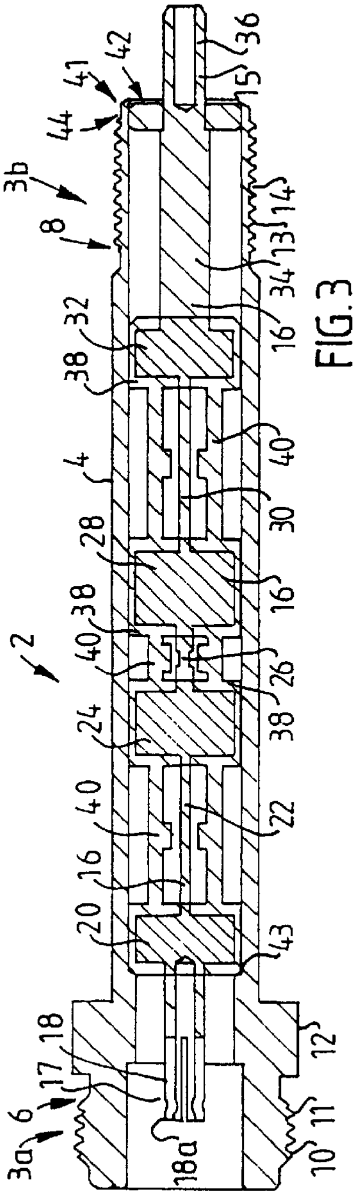
FIG. 3 is a longitudinal section of the filter according to FIG. 2.

FIG. 3 shows a longitudinal section of the first embodiment of the filter 2. According to this embodiment the filter 2 is a Low-Pass (LP) filter and the connecting means 3*a* is provided as a standard connector. The LP filter 2 comprises a conductor 16 that passes through the whole filter 2 inside the casing 4 in the direction of the axis I. The conductor 16 is turned in one piece and comprises ten essentially circularly cylindrical portions 18, 20, 22, 24, 26, 28, 30, 32, 34, 36 with varying diameters. In this embodiment all portions 18, 20, 22, 24, 26, 28, 30, 32, 34, 36 of the conductor 16 are arranged co-axially along the axis 1, but it is also possible that only one or a few of the portions 18, 20, 22, 24, 26, 28, 30, 32, 34, 36 are arranged co-axially along the axis 1. Every portion is connected to the closest previous portion according to the above order. A second connecting member 17 comprises the first portion 18 of the conductor 16, which is arranged concentrically in the first end 6 of the filter 2. The portion 18 is shaped as a longitudinal extended, circularly cylindrical shell, one of the ends 18*a* of which is free, and from this shell are four axially directed slits taken from the free end 18*a* towards the second portion 20. Of course the number of slits can be varied. The second, fourth, sixth and eighth portions 20, 24, 28, 32 have a larger diameter than the third, fifth and seventh portions 22, 26, 30. The third and seventh portions 22, 30 have a longer axially extension than the fifth portion 26. The ninth portion 34 has a larger diameter than the third, fifth and seventh portions 22, 26, 30, but a smaller diameter than the second, forth, sixth and eighth portions 20, 24, 28, 32. This portion 34 is only meant to give the filter 2 a desired length and has no further function for the filtering. A forth connecting member 37 is in this embodiment the tenth portion 36. It projects partly outside the casing 4 at the second end 8 of the casing 4 and is intended to be a soldering connection end. This portion 36 is hollow to give a small dissipation of heat during soldering and its diameter is slightly smaller than the diameter of the ninth portion 34.

The portions 20,24,28,32 and the portions 22,26,30 operate together with the metallic casing 4 as a LP filter, as shown in JP-08018305 A. Thus the portions 20,24,28,32 generate capacitance together with the metallic casing 4 while the portions 22, 26, 30 generate inductance. The number of, the size of and the distance between the capacitance generating portions 20,24,29,32 determine the frequency characteristic of the filter. The material of the conductor 16 ought to have good contacting features and to be elastic. Suitable such materials are tinbronze or berylliumcopper. The conductor 16 is in the first portion 18 gilded such that a good contact will be obtained, and the remaining part of the conductor is silvered to achieve a good conductivity.

The portions 20,24,28,32 are completely covered by an insulator 3 8, cast around them. The insulator 38 is provided for mechanically fasten the different parts in the filter and to protect against breakdown voltage. To avoid capacitance at the portions 22,26,30, where inductance is wanted they should not be covered by the insulator but surrounded by air that has a lower dielectric constant than the insulator and thereby provides a lower capacitance. There are two axially directed junction means 40 between every portion 20,24,28, 32, which connects the insulator around these portions with each other. The number of junction means can, of course be varied. The junction means 40 consists of the same insulation material that is cast around the portions 20,24,28,32, and they have as only technical function to facilitate the cast of the insulator 38, the insulator 38 and junction means 40 providing one continuos unity. Suitable insulation materials are polyetherimid, polyarylamide or polytetrafluorethene of a quality possible to cast.

At the first end 6 of the casing 4 the casing 4 has a inner diameter that is slightly smaller than the inner diameter of the rest of the casing. This projection provides a first stopping means 43, which is intended to keep the conductor 16 of the filter 2 in the right place in the casing 4. In the second end 8 of the filter 2 there is a second stopping means 44, which comprises a ring 42 of insulating material, which is placed around the tenth portion 36 against the ninth portion 34, which has a slightly larger diameter than the tenth portion 36. The stopping means 44 comprises further a ring-shaped edge 41, outermost at the second end 8 of the casing 4, which is folded in over the ring 42. This folding causes that the ring 42 and thus also the whole conductor 16 is pressed against the first stopping means 43.

Figure 4:
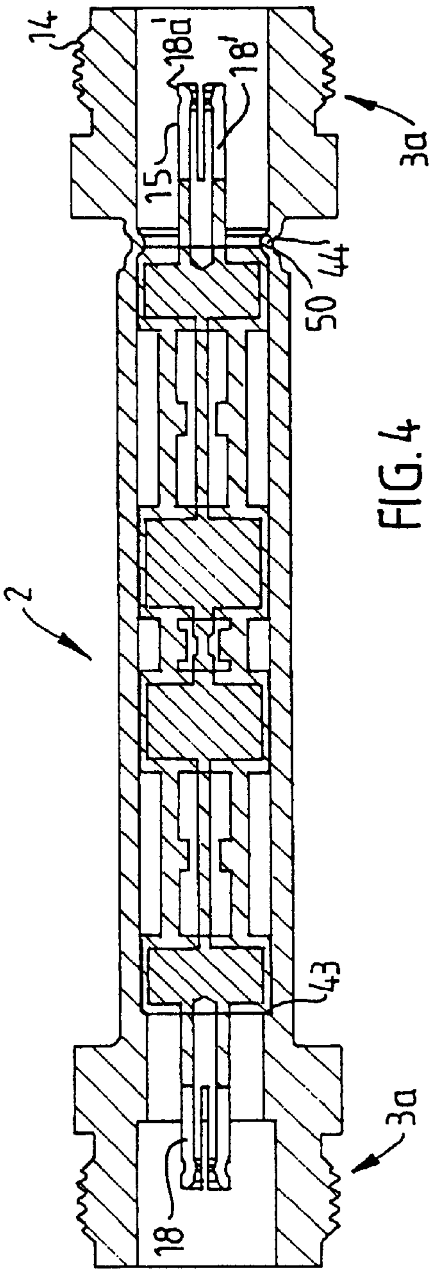
FIG. 4 shows a Low-Pass (LP) filter with integrated connecting means of the same sort in both ends.

FIG. 4 shows a longitudinal section of a second embodiment of the filter 2 according to the invention. According to this embodiment the filter 2 has integrated connecting means 3*a* of the same sort in both ends. The details are the same as in FIGS. 1–3, besides that the second end 8 of the filter 2 in this embodiment being on the whole the same as the first end 6, which is of the same kind as in the previously described embodiment. This means that the third connecting member 13, in this second embodiment, is of the same kind as the second connecting member 17. A portion 18' of the same kind as the first portion 18 replaces also the ninth and tenth portions 34,36. The difference between the first and second end 6,8 is only that the first stopping means 43, the projection, present in the first end 6, is not present in the second end 8. During the mounting the conductor 16 is pushed in through the second end 8 of the casing 4, and, in order to fasten the conductor 16 in the casing 4 and provide a second stopping means 44, the casing 4 is embossed in the second end 8 such that a decreased inner diameter 50 in the casing 4 is provided and the eighth portion 32 is pressed axially towards the middle.

Figure 5:
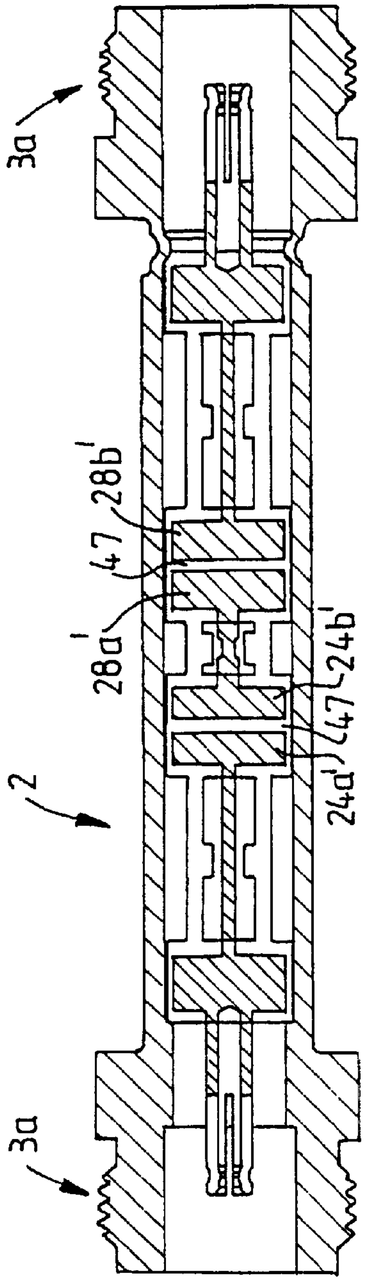
FIG. 5 shows a Band-Pass (BP) filter with integrated connecting means of the same sort in both ends.

FIG. 5 shows longitudinal section of a third embodiment of the filter according to the invention. According to this embodiment the filter is a Band-Pass (BP) filter. Such a filter allows frequencies in a certain interval to pass as distinguished from the LP-filter that allows all frequencies under a certain frequency to pass. The details are the same as in FIGS. 1–4 except that two of the capacitance generating portions 24,28 have been divided into two smaller, circularly cylindrical portions 24*a*', 24*b*' and 28*a*', 28*b*', respectively, following each other in the direction of the axis. The portions 24*a*' and 24*b*' and 28*a*', 28*b*', respectively, are separated by a gap 47, which is filled with a dielectric, for example air, ceramic or the same insulating material that is cast around the portions 20,24,28,32. In the last mentioned case the insulator 38 and the dielectric together with the junction means 40 provide a continuos unit. To provide a BP-filter, one or more of the capacitance generating portions 20,24,28,32 could be divided as the portions 24,28 in the third embodiment, FIG. 5.

Of course the BP-filter can be provided with a connecting means 3*a* in one of the ends and a connecting means 3*b* in the other end or a connecting means 3*b* in both ends.

Other variants concerning the location of the insulator 38 in the filter 2 could for example be that the whole conductor 16 is covered by the insulator, which is cast around it. Then it would also be possible to replace the two stopping means 43,44 by one stopping means, which is an emboss somewhere on the casing. This emboss causes a decrease in the inner diameter in the casing 4, which in turn causes the insulating material to deform a bit, and the conductor 16 is fixed in the casing 4.

The ring 42 could also provide a continues unit together with the cast insulator 38.

Of course a filter 2 with connecting means 3*b* of the same sort in each end is possible. Hereby a filter 2 that is connected by soldering in both ends is achieved.

What is claimed is:

1. A filter, comprising:

a first end, a second end, a conducting casing, at least one central conductor, and connecting means at each of the first and second ends, wherein the conducting casing extends along an imaginary axis for accommodating the central conductor along the imaginary axis; the central conductor includes capacitance generating portions and inductance generating portions; the connecting means at the first end includes a first connecting member connected to the conducting casing and a second connecting member connected to the central conductor; the connecting means at the second end includes a third connecting member connected to the conducting casing and a fourth connecting member connected to the central conductor; and the second and fourth connecting members are integral with the central conductor.

2. The filter of claim 1, further comprising an insulator that covers at least one part of at least one of the capacitance generating portions of the central conductor and that is arranged on the at least one capacitance generating portion.

3. The filter of claim 2, wherein the insulator is cast directly on the at least one capacitance generating portion.

4. The filter of claim 3, further comprising at least one axially directed junction means, between the capacitance generating portions, for connecting the insulator around these, the junction means comprising the same material that is cast around the portions, and the insulator and the junction means providing a continuous unit.

5. The filter of claim 1, wherein the conducting casing includes at least one stopping means for fastening the conductor co-axially in the conducting casing.

6. The filter of claim 5, wherein a stopping means is a projection on the inside of the conducting casing at one of the ends, whereby the capacitance generating portion closest to the second connecting member, which has a diameter, together with the insulator, such that it precisely fits in the rest of the conducting casing, is stopped at the projection.

7. The filter of claim 5, wherein at least one of the stopping means comprises at least one emboss in the conducting casing, the emboss causing a decrease in an inner diameter of the casing.

8. The filter of claim 5, wherein at least one of the stopping means comprises a ring of insulating material placed around an end adapted for soldering connection against one part of the conductor that has a larger diameter than the end adapted for soldering connection and a ring-shaped edge, outermost at the other end of the casing, which is folded in over the ring, this folding causing the ring and thereby the conductor to be pressed against the stopping means in the opposite end.

9. The filter of claim 1, wherein at least one of the second and fourth connecting members is a soldering connection end having a form of a circularly cylindrical shell.

10. The filter of claim 1, wherein at least one of the second and fourth connecting members is a circularly cylindrical shell extending in a longitudinal direction, one of the ends of which is free and from which at least one axially directed slit is taken towards the capacitance generating portion that is closest to the fourth connecting member.

11. The filter of claim 1, wherein the first connecting member and the third connecting member are integral with the casing, and the casing is provided in one piece.

12. The filter of claim 1, wherein the first and third connecting members are threaded.

13. The filter of claim 1, wherein the conductor is provided in one piece, and the filter is a low-pass filter.

14. The filter of claim 1, wherein at least one of the capacitance generating portions is divided into two smaller portions that follow each other in the direction of the axis, the two smaller portions being separated by a gap that is filled with at least one dielectric, whereby the filter is a band-pass filter.

15. The filter of claim 14, wherein the dielectric is of the same insulating material that is cast around the portions, and the insulator and the dielectric are continuous.

16. The filter of claim 1, wherein the conducting casing and portions of the conductor are substantially circularly cylindrical, the capacitance generating portions having the largest diameter; and at least one of the portions is arranged co-axially along the imaginary axis.

* * * * *